(12) United States Patent
Roh et al.

(10) Patent No.: US 6,297,091 B1
(45) Date of Patent: Oct. 2, 2001

(54) METHOD FOR FABRICATING CONTACT PAD FOR SEMICONDUCTOR DEVICE

(75) Inventors: Jae Sung Roh, Kyonggi-do; Sang Hyun Kim, Chungcheongbuk-do; Bong Soo Kim, Seoul, all of (KR)

(73) Assignee: Hyundai Micro Electronics Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/397,136

(22) Filed: Sep. 16, 1999

(30) Foreign Application Priority Data

Jul. 20, 1999 (KR) ................................................ 99/29930

(51) Int. Cl.⁷ ............................................. H01L 21/8242
(52) U.S. Cl. ........................ 438/256; 438/399; 438/481; 438/618; 438/631; 438/637
(58) Field of Search ..................................... 438/253, 256, 438/396, 399, 481, 618, 631, 637

(56) References Cited

U.S. PATENT DOCUMENTS 5,296,400 * 3/1994 Park et al. ............................ 438/253
5,395,784 * 3/1995 Lu et al. ............................... 438/241

* cited by examiner

*Primary Examiner*—Charles Bowers
*Assistant Examiner*—Asok Kumar Sarkar
(74) *Attorney, Agent, or Firm*—Morgan, Lewis & Bockius LLP

(57) ABSTRACT

A method for fabricating a contact pad for a semiconductor device, including the steps of forming device isolation layers in a semiconductor substrate to define active regions, forming a plurality of wordlines crossing the active regions, forming an insulating layer on an entire surface, and selectively removing the insulating layer on storage node contact regions, a bitline contact region, and the device isolation layer in contact with the bitline contact region, so as to form an epitaxial growth blocking layer, and conducting an epitaxial growth using the epitaxial growth blocking layer as a mask, to form a storage node contact pad as well as a bitline contact pad by causing an epitaxial layer grown in the bitline contact region to extend laterally toward the device isolation layer.

23 Claims, 9 Drawing Sheets

METHOD FOR FABRICATING CONTACT PAD FOR SEMICONDUCTOR DEVICE

BACKGROUND OF THE INVENTION

1. Field of the Invention

The present invention relates to semiconductor devices, and more particularly, to a method for fabricating contact pads for semiconductor devices, which permits an adequate fabrication allowance and simplifies the fabrication process of the contact pad.

2. Background of the Related Art

As high density semiconductor device packing improves, there has been a great deal of research into forming sub-micron patterns required for high density semiconductor device packing. Particularly, for formation of a contact pad mostly used for securing an alignment allowance in a cell transistor including both a bitline contact for electrically connecting a bitline and a drain, and a storage node contact for connecting a storage node and a source, through a sub-micron pattern ranging down to 0.1 µm, there have been difficulties due to limitations of photolithography.

Fabrication of a related art contact pad for a semiconductor device will be explained with reference to the attached drawings. FIG. 1 illustrates a layout of a related art semiconductor device, and FIGS. 2A–2D illustrate cross-sections along A–A' in FIG. 1 showing the steps of a related art method for fabricating a contact pad.

Referring to FIG. 1, the related art method for fabricating a contact pad employs an anisotropic epitaxial growth, wherein active regions 12 is defined by a field oxide film formed in a device isolation region 13, and wordlines 11, disposed in a short axis direction of the active region 12, are formed. Contact pads 14 are formed on active regions on both sides centered around the wordline. A bitline contact 15 is formed in the contact pad 14 on one side of the wordline. A storage node contact 16 is formed in the contact pad 14 on the other side of the wordline 11.

A related art process for fabricating the contact pad for a semiconductor memory will be explained with reference to FIGS. 2A–2D, showing a cross-section along line A–A'.

Referring to FIG. 2A, a field oxide film 2 is formed on a device isolation region in a semiconductor substrate 1 to define an active region. A plurality of wordlines 11, spaced at fixed intervals, are formed, and a sidewall insulating layer 3 covering sides and a top of each wordline 11 is formed. Ions are lightly implanted before formation of the sidewall insulating layer 3, and ions are heavily implanted after formation of the sidewall insulating layer 3, to form source/drain regions (not shown) in a surface of the semiconductor substrate 1 on both sides of the wordline 11.

Then, as shown in FIG. 2B, an anisotropic epitaxial growth is selectively conducted to grow the semiconductor substrate 1 that is exposed on both sides of the wordline 11, to form contact pads 14. The anisotropic epitaxial growth prevents merging of adjacent contact pads 14 due to lateral growth of the silicon layer, which can happen if the silicon layer is grown isotropically.

As shown in FIG. 2C, an interlayer insulating layer 4 is formed on an entire surface, and bitline contact pads are opened selectively, to form a plug layer and a bitline 5. Then, as shown in FIG. 2D, another interlayer insulating layer 6 is formed on an entire surface, including the bitline 5, and storage node contact pads are selectively opened, to form a plug layer and a storage node 7.

Alternatively, polysilicon may be put in spaces between wordlines before formation of the plug layer, and the polysilicon is selectively removed, leaving only the contact pad regions as they. However, this fabrication method is complicated and inefficient.

The related art method for fabricating a contact pad has the following problems.

The high degree of vacuum required, in a range of 1.0E9–1.0E10 Torr, for the anisotropic epitaxial growth is not favorable in view of equipment and process management compared to a general epitaxial growth.

In a COB structured DRAM in which a bitline passes not right over an active region of a cell, but between active regions, the contact pad formed on the active region should be extended to a position where the bitline is formed, for bringing the bitline into contact with the active region. Accordingly, the anisotropic epitaxial growth should be conducted considering the extension of the contact pad, which complicates the fabrication process and the device structure.

SUMMARY OF THE INVENTION

Accordingly, the present invention is directed to a method for fabricating a contact pad for a semiconductor device that substantially obviates one or more of the problems due to limitations and disadvantages of the related art.

An object of the present invention is to provide a method for fabricating a contact pad for a semiconductor device, which permits an adequate process allowance and simplifies a fabrication process in formation of the contact pad.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a contact pad for a semiconductor device includes the steps of forming device isolation layers in a semiconductor substrate to define active regions, forming a plurality of wordlines crossing the active regions, forming an insulating layer on an entire surface, and selectively removing the insulating layer on storage node contact regions, a bitline contact region, and the device isolation layer in contact with the bitline contact region, to form an epitaxial growth blocking layer, and conducting an epitaxial growth using the epitaxial growth blocking layer as a mask, to form a storage node contact pad as well as a bitline contact pad by causing an epitaxial layer grown in the bitline contact region to extend laterally toward the device isolation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 3A, 3B, 3C–7A, 7B, and 7C illustrate layouts and cross-sections showing the steps of a method for fabricating a contact pad in accordance with a preferred embodiment of the present invention.

DETAILED DESCRIPTION OF THE PREFERRED EMBODIMENT

Reference will now be made in detail to the preferred embodiments of the present invention, examples of which are illustrated in the accompanying drawings. FIGS. 3A, 3B, 3C–7A, 7B, and 7C illustrate layouts and cross-sections showing the steps of a method for fabricating a contact pad in accordance with a preferred embodiment of the present invention (note that peripheral circuit regions are not shown in respective layouts). FIGS. 3B–7B illustrate cross-sections across line B–B' in respective layout drawings, and FIGS. 3C–7C illustrate cross-sections across line C–C' in respective layout drawings.

Figure 1:
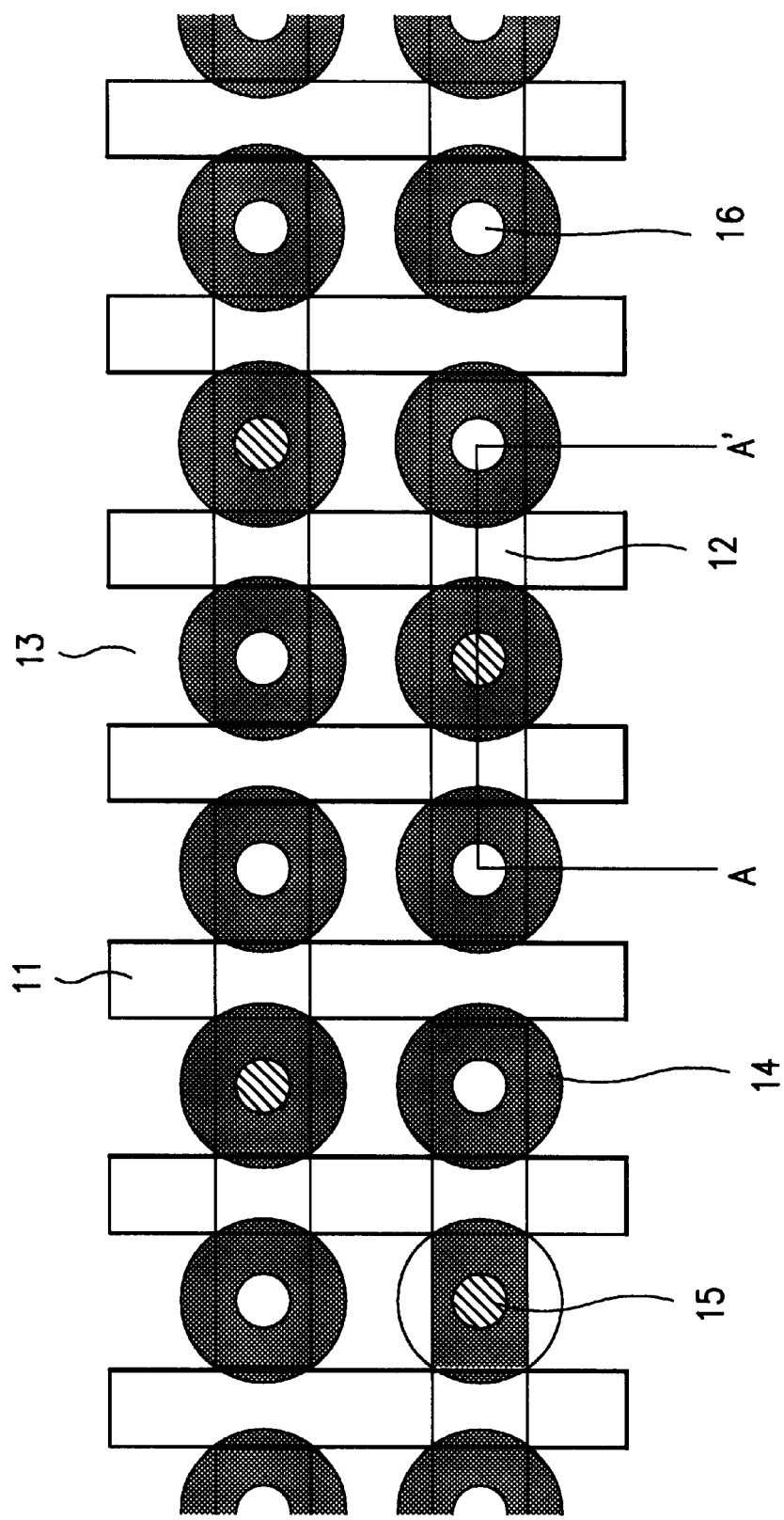
FIG. 1 illustrates a layout of a related art semiconductor device.
Figure 2A:
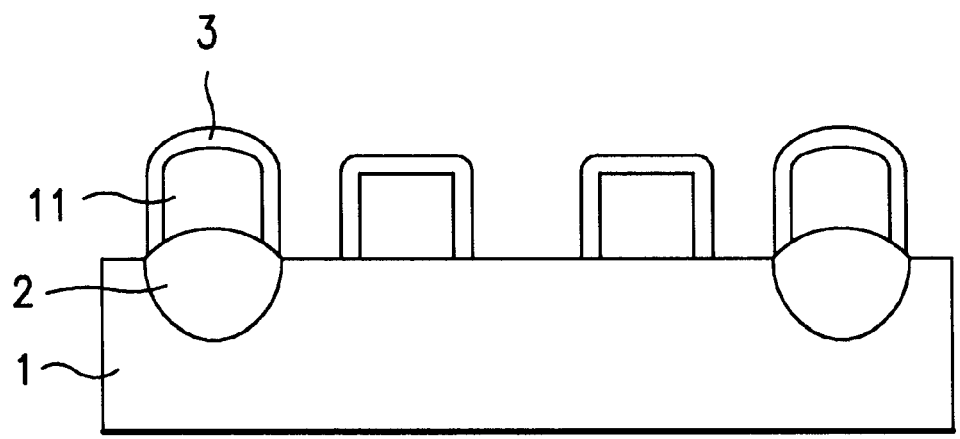
FIGS. 2A–2D illustrate cross-sections across A–A' in FIG. 1 showing the steps of a related art method for fabricating a contact pad.
Figure 2B:
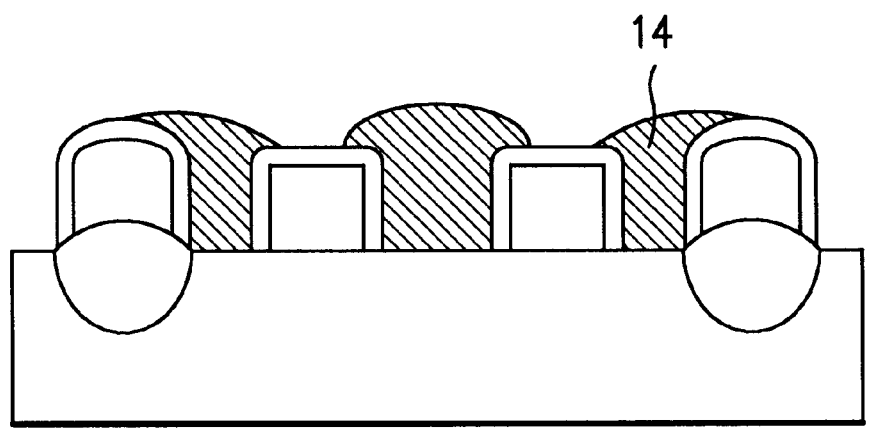
Figure 2C:
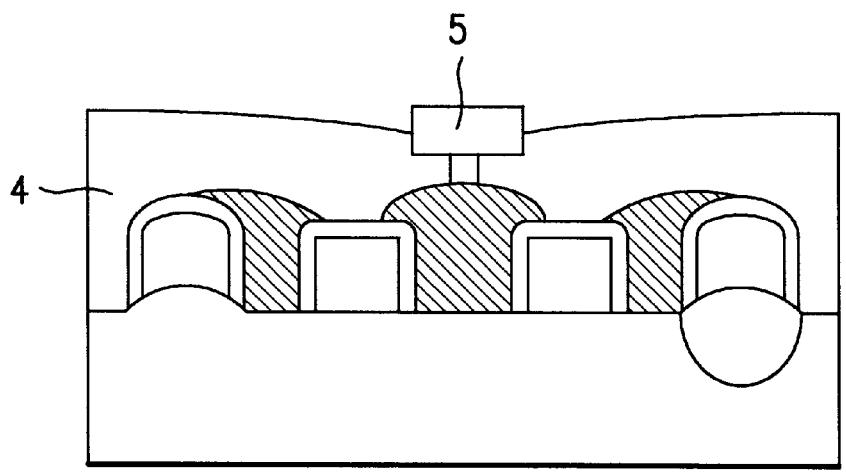
Figure 2D:
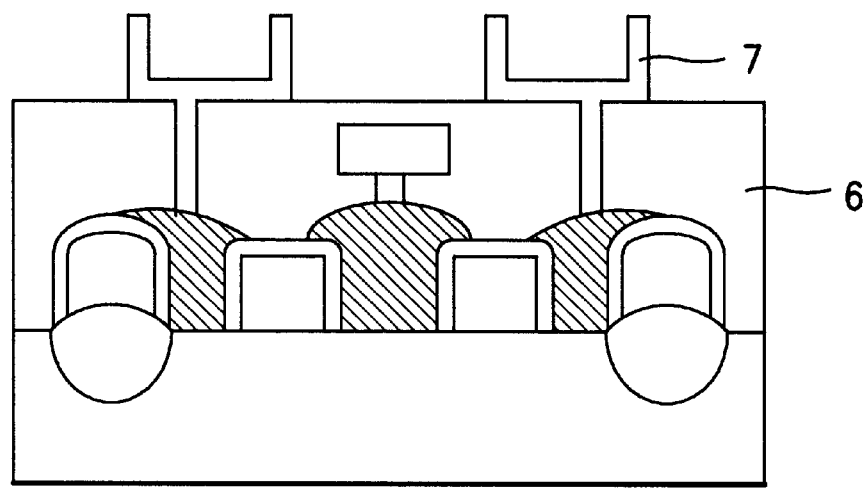
Figure 3A:
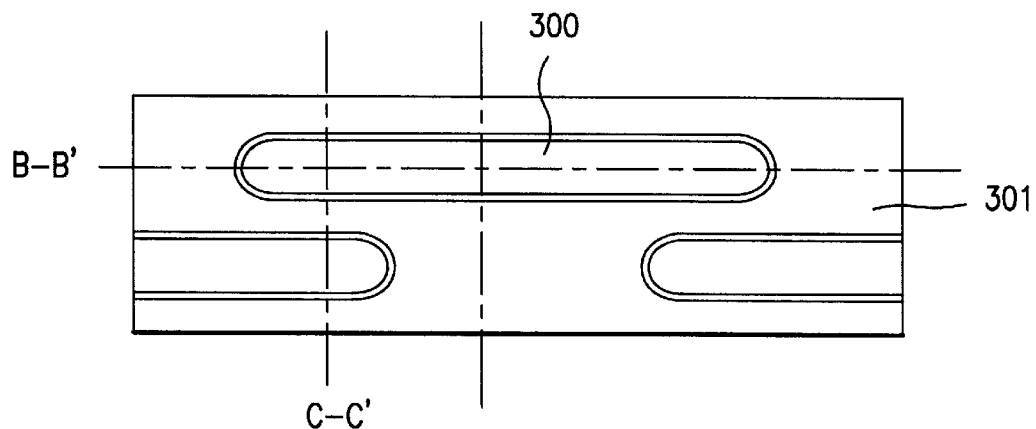
Figure 3B:
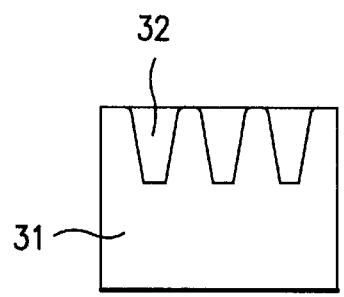
Figure 3C:
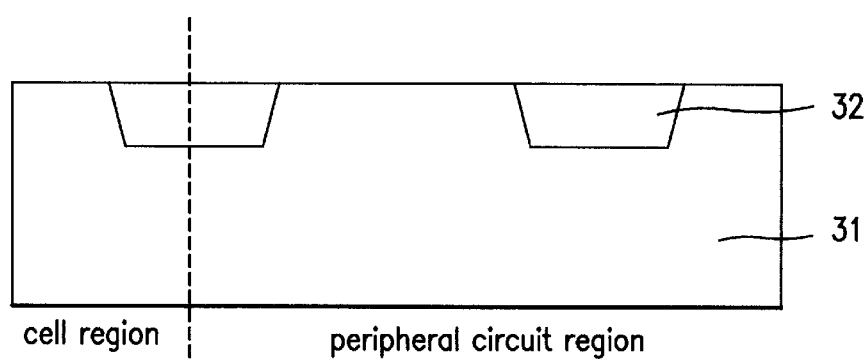
Figure 4A:
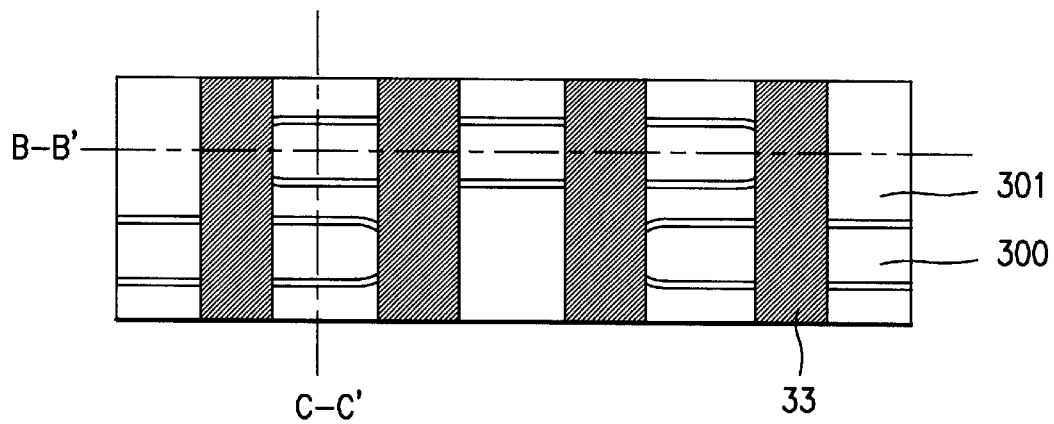
Figure 4B:
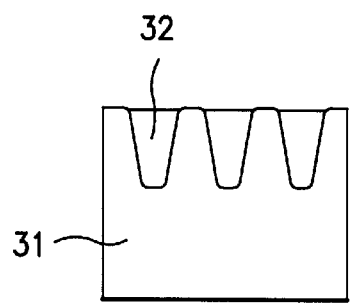
Figure 4C:
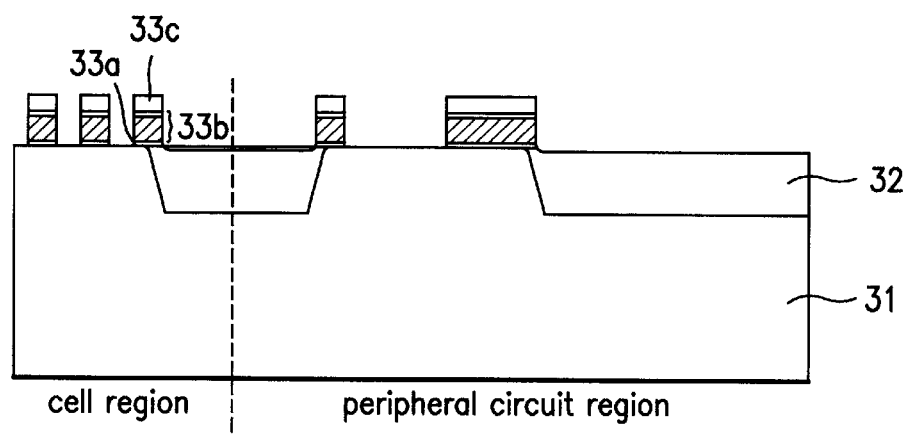

Referring to FIGS. 3A, 3B and 3C, the method for fabricating a contact pad in accordance with a preferred embodiment of the present invention starts with defining on a semiconductor substrate 31 a device isolation region 301 and active regions 300, and forming device isolation layers 32 in the device isolation region 301 by an STI (Shallow Trench Isolation) process. The device isolation layer 32 is formed by etching the device isolation region 301 to a defined depth to form a trench, depositing an oxide film by CVD on an entire surface, and planarizing by CMP. And, as shown in FIGS. 4A, 4B and 4C, wordlines 33 are formed crossing the active regions 300 in a short axis direction. After a gate oxide film 33a, a conductive film 33b and a capping layer 33c are formed in succession on an entire surface of the semiconductor substrate 31 having the device isolation layer 32 formed therein, the wordlines 33 are formed by etching selectively using photolithography. The conductive film 33b includes a barrier layer, and the peripheral circuit region has a gate electrode layer for forming a device with a high operating voltage. Thereafter, though not shown in the drawings, impurities are implanted into surfaces of the semiconductor substrate 31 on both sides of the gate electrode layer in the cell region for forming source/drain.

Figure 5A:
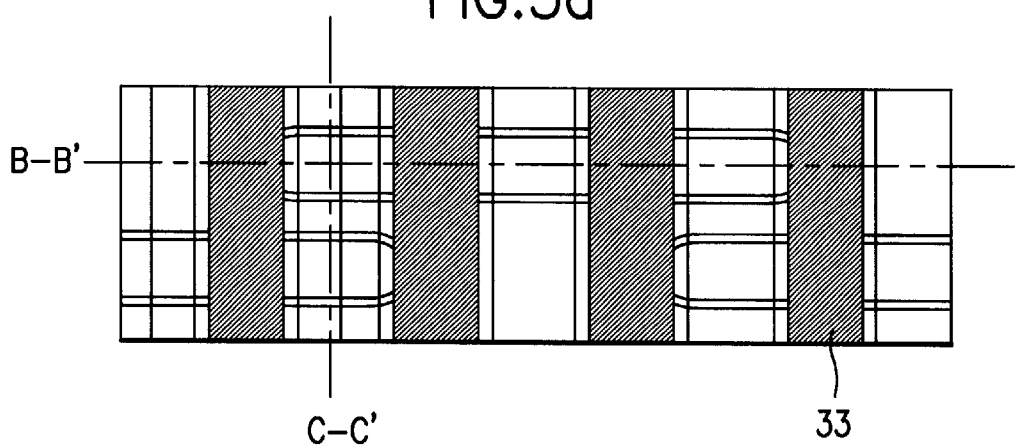
Figure 5B:
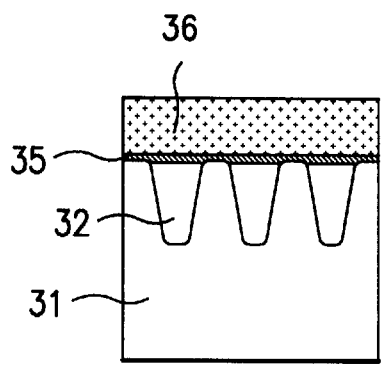
Figure 5C:
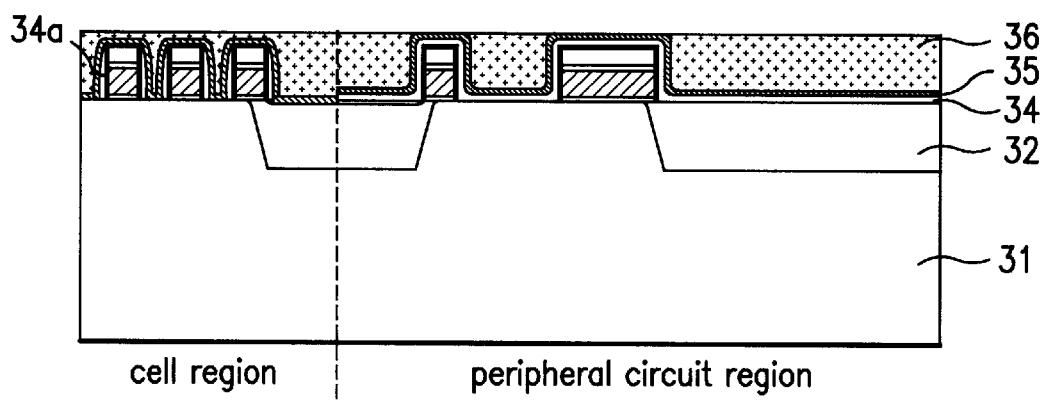

Then, as shown in FIGS. 5A, 5B and 5C, a first insulating layer 34 is formed on an entire surface having the wordlines 33 formed thereon, for forming sidewalls. A photomask layer (not shown) is formed on the first insulating layer 34 in the peripheral circuit region, and etched back to form gate sidewalls 34a at both sides of the wordlines 33 in the cell region. Then, a second insulating layer 35 is formed on an entire surface in the cell region having the gate sidewalls 34a formed thereon and in the peripheral circuit region. The second insulating layer 35 is formed of nitride. An oxide film is deposited on the second insulating layer 35 by CVD, to form a third insulating layer 36. After deposition of the third insulating layer 36, it is planarized such that the second insulating layer 35 in the cell region is not exposed. The planarizing is done by a CMP (chemical mechanical polishing).

Figure 6A:
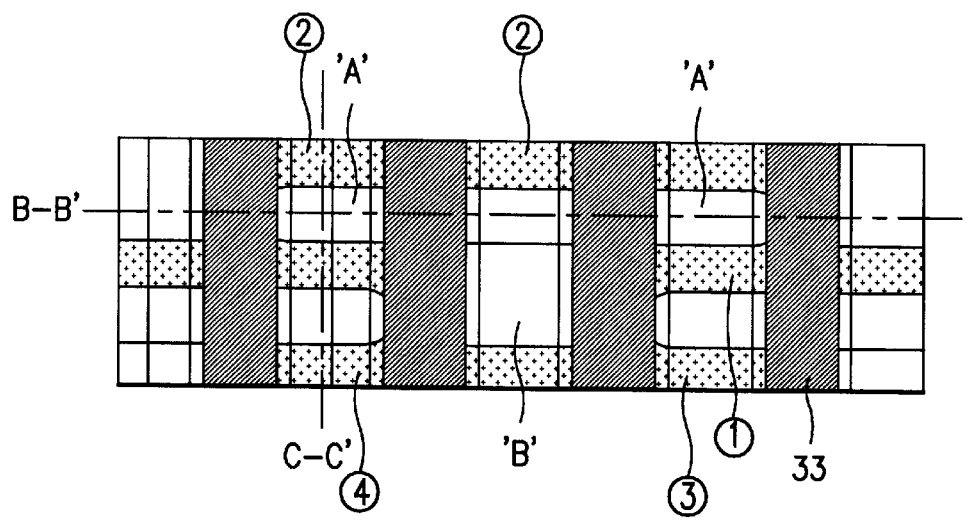
Figure 6B:
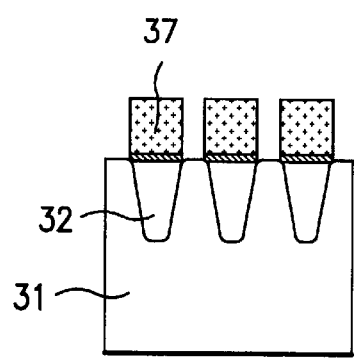
Figure 6C:
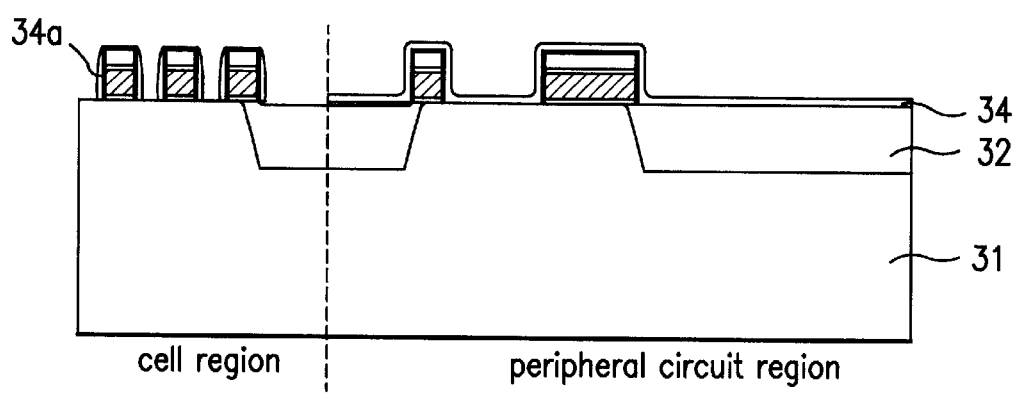

As shown in FIGS. 6A, 6B and 6C, a photomask layer (not shown) is formed on the third insulating layer 36, excluding bitline contact portions 'A' and storage node contact portions 'B', and the exposed third insulating layer 36 is selectively etched. Etching of the third insulating layer 36 is done by self-align contact SAC utilizing a high etch selectivity over underlying second insulating layer 35. This selective etching forms an inhibition layer that inhibits lateral extension growth in a follow-on epitaxial growth. The inhibition layers, i.e., epitaxial growth blocking layers 37, are formed on portions ①②③④.

In this instance, during the epitaxial growth, the epitaxial growth blocking layers 37 and the wordlines 33 act as the lateral growth inhibition layer in the storage node contact portion 'B'. The bitline contact portion 'A' (excluding the active region 300) is the portion which requires lateral extension growth of the epitaxial layer for assuring bitline contact when the bitline passes not over the active region 300, but between adjacent active regions 300. The epitaxial growth blocking layer 37 has a first side, and a second side opposite to the first side, each aligned to an interface between the active region 300 and the device isolation region 301, and a third side and a fourth side opposite to the third side each in contact with one of the wordlines 33. That is, the epitaxial growth blocking layer 37 is formed on the device isolation layer 32 in contact with the active region 300 across which no wordline 33 passes, excluding the bitline it is in contact with.

Figure 7A:
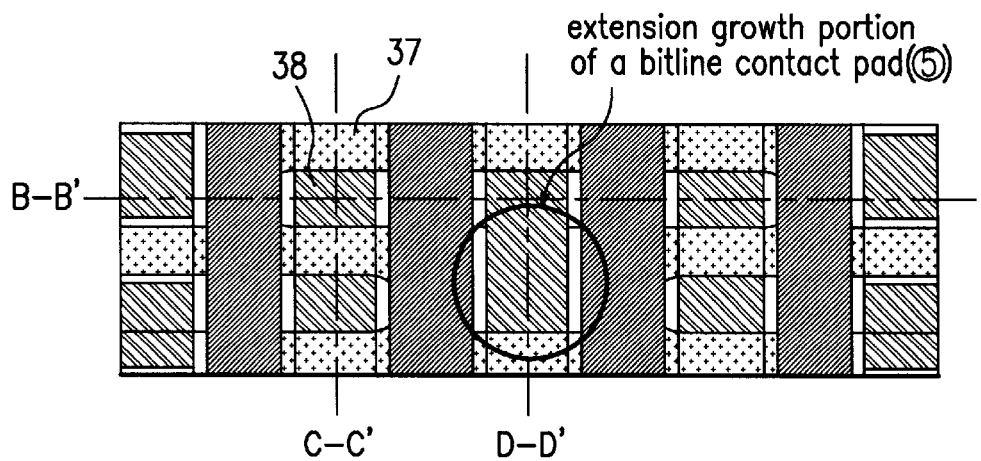
Figure 7B:
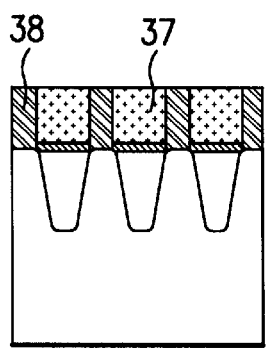
Figure 7C:
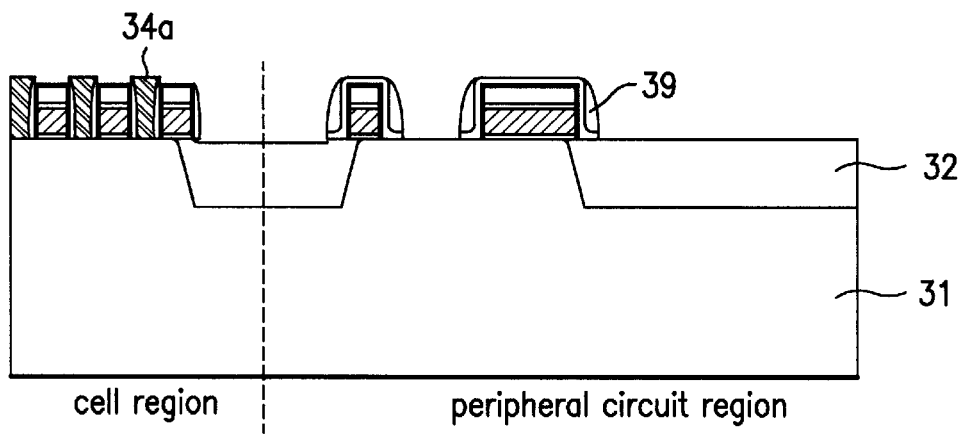

Then, as shown in FIGS. 7A, 7B and 7C, a general isotropic epitaxial growth is selectively conducted utilizing the epitaxial growth blocking layer 37, to form contact pads 38. The epitaxial growth is conducted at a temperature ranging 780–900° C., under a pressure ranging between 20–100 Torr, using gases of 100–1000 sccm DCS, 100–500 sccm HCl and 10–40 slm $H_2$. During the epitaxial growth, the epitaxial growth layer on the bitline contact region extends in one direction such that a portion of the epitaxial growth layer is positioned on the device isolation layer 32, as shown in FIG. 8.

Upon completion of formation of the contact pads 38, gate sidewalls 39 are formed at both sides of the gate electrode on the peripheral circuit region, and ion implantation is carried out, to form source/drain regions (not shown). Then, storage nodes and bitlines are formed. The bitline is formed, not on the active region 300, but in a region between two adjacent active regions 300, parallel to the wordline 33. One portion of the bitline passes on a portion of the contact pad having a lateral extension growth (⑤ in FIG. 7A, and ⑥ in FIG. 8). A portion ⑦ in FIG. 8 is a portion at which the epitaxial growth actually takes place.

Figure 8:
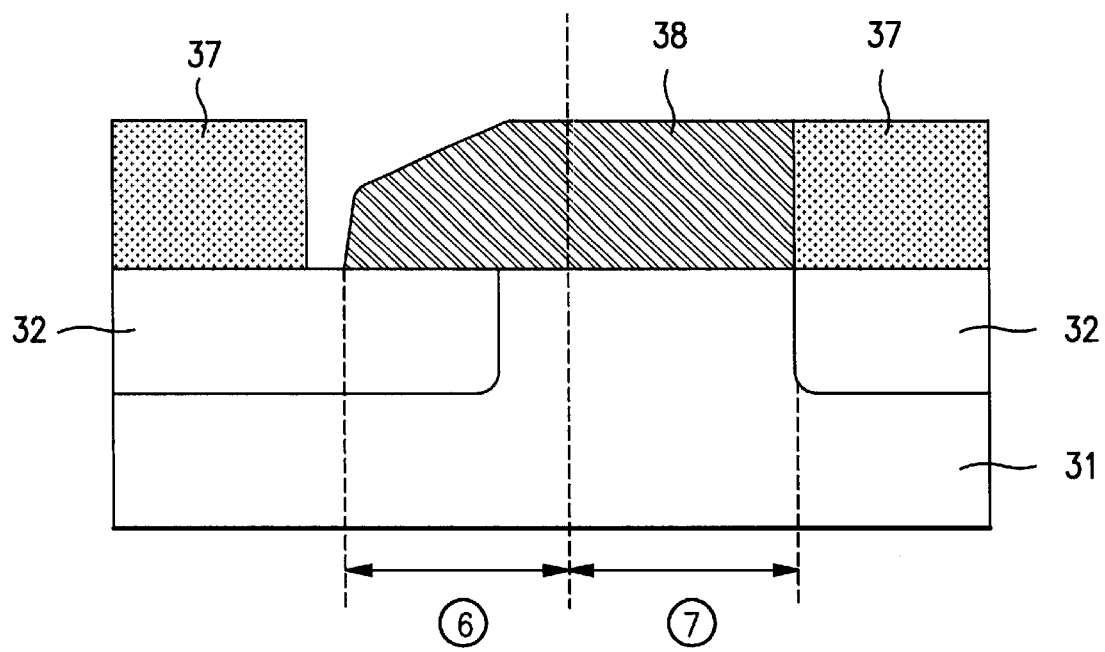
FIG. 8 illustrates a cross-section along line D–D' in FIG. 7A showing a principle of a contact pad extension.

FIG. 8 illustrates a cross-section along line D–D' in FIG. 7A showing a principle of a contact pad extension. A salicide may be formed before formation of the bitline, when metal suicides are selectively formed on the active region in the peripheral circuit region and the contact pad portions in the cell region, which reduces a contact resistance between a metal wiring and the active region in the peripheral circuit region, and also reduces a contact resistance between the contact pad and the metal wiring.

The method for fabricating a contact pad for a semiconductor device of the present invention facilitates simultaneous formation of storage node contact portions and bitline contact portions, and the contact pad to be brought into contact with the bitline by lateral extension growth of the contact pad in the epitaxial growth of the contact pad which can not be in contact with the bitline in an initially defined active region.

The method for fabricating a contact pad for a semiconductor device of the present invention has the following advantages.

First, because the silicon epitaxial growth technology permits application to a high density device packing (over 4 Gbit RAM) for formation of contact pads, a number of fabrication steps can be reduced.

Second, an increase of resistance caused by a contact size reduction can be controlled.

Third, instead of anisotropic epitaxial growth, which requires complicated fabrication conditions, isotropic epitaxial growth can be used, which is favorable in view of equipment management and application to a mass production.

It will be apparent to those skilled in the art that various modifications and variations can be made in the method for fabricating a contact pad for a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a contact pad for a semiconductor device, comprising the steps of:
    forming device isolation layers in a semiconductor substrate to define active regions;
    forming a plurality of wordlines crossing the active regions;
    forming an insulating layer on an entire surface, and selectively removing the insulating layer on storage node contact regions, a bitline contact region, and the device isolation layer in contact with the bitline contact region, to form an epitaxial growth blocking layer; and
    conducting an epitaxial growth using the epitaxial growth blocking layer as a mask, to form a storage node contact pad as well as a bitline contact pad by causing an epitaxial layer grown in the bitline contact region to extend laterally toward the device isolation layer.

2. The method as claimed in claim 1, wherein the contact pad is formed by isotropic epitaxial growth.

3. The method as claimed in claim 1, wherein the epitaxial growth is conducted at a temperature ranging 780–900 C. under a pressure ranging 20–100 Torr using gases of 100–1000 sccm DCS, 100–500 sccm HCl and 10–40 slm $H_2$.

4. The method as claimed in claim 1, wherein the insulating layer for forming the epitaxial growth blocking layer is formed of an oxide by CVD.

5. The method as claimed in claim 4, further including the step of forming a nitride layer before forming the oxide.

6. The method as claimed in claim 1, wherein the epitaxial growth blocking layer includes a first side and a second side opposite to the first side and both aligned to an interface between the active region and the device isolation region, and a third side and a fourth side opposite to the third side and both in contact with one of the wordlines.

7. The method as claimed in claim 6, wherein the epitaxial growth blocking layer is formed on the device isolation layer in contact with the active regions where none of the wordlines crosses and excluding a portion where the bitline is not in contact.

8. The method as claimed in claim 7, wherein the bitline contact pad is formed following the conducting the epitaxial growth step.

9. A method for fabricating a contact pad for a semiconductor device, comprising the steps of:
    forming device isolation layers in device isolation regions in a semiconductor substrate that includes a cell region and a peripheral circuit region by STI (shallow trench isolation), to define active regions;
    forming wordlines crossing the active regions in a short axis direction;
    forming a first insulating layer on an entire surface that has the wordlines formed thereon;
    forming a first photomask layer on the peripheral circuit region, and etching the photomask layer back to form gate sidewalls at both sides of the wordlines in the cell region;
    forming a second insulating layer and a third insulating layer;
    planarizing the third insulating layer;
    forming a second photomask layer on the third insulating layer excluding a bitline contact portion, an extension growth region in contact with the bitline contact portion, and a storage contact portion, and selectively etching an exposed portion of the third insulating layer, to form epitaxial growth blocking layer; and
    using the epitaxial growth blocking layer to isotropically grow a contact pad.

10. The method as claimed in claim 9, wherein the step of forming device isolation layers includes the steps of:
    etching the device isolation region to form a trench;
    depositing an oxide film on an entire surface by chemical vapor deposition (CVD); and
    planarizing the oxide film by chemical mechanical polishing (CMP).

11. The method as claimed in claim 9, wherein the step of forming wordliness includes the steps of:
    forming a gate oxide film, a conductive film, and a capping layer in succession on an entire surface of the semiconductor substrate having the device isolation layers formed thereon, and
    selectively etching by photolithography.

12. The method as claimed in claim 11, wherein the conductive film includes a barrier layer.

13. The method as claimed in claim 9, wherein the second insulating layer is formed of nitride.

14. The method as claimed in claim 9, wherein the third insulating layer is formed on the second insulating layer of an oxide deposited by CVD.

15. The method as claimed in claim 9, wherein the third insulating layer is planarized by CMP such that the second insulating layer in the cell region is not exposed.

16. The method as claimed in claim 9, wherein the etching of the third insulating layer is done by self-align contact SAC using etch selectivity over an underlying second insulating layer.

17. The method as claimed in claim 9, wherein the epitaxial growth is conducted at a temperature ranging 780–900 C. under a pressure ranging between 20–100 Torr using gases of 100–100 sccm DCS, 100–500 sccm HCl and 10–40 slm $H_2$.

18. The method as claimed in claim 17, wherein the epitaxial growth layer in the bitline contact region extends laterally in one direction, so that a portion of the epitaxial growth layer is positioned on the device isolation layer.

19. The method as claimed in claim 9, further comprising the steps of:
    forming gate sidewalls at both sides of a gate electrode in the peripheral circuit region upon completion of the step of isotropically growing the contact pad;

conducting ion implantation to form source/drain regions; and forming storage nodes and bitlines.

20. The method as claimed in claim 19, wherein the bitline is formed not on the active region, but in a region between two adjacent active regions parallel to a long axis of the wordline.

21. The method as claimed in claim 20, wherein one portion of the bitline passes across a contact pad on the device isolation region where a portion of the bitline contact pad extends laterally due to epitaxial growth extension.

22. The method as claimed in claim 19, wherein a salicide is formed before the formation of the bitline, so as to selectively form metal silicides at contact pad portions on the active regions in the peripheral circuit region and the contact pad portions in the cell region.

23. The method as claimed in claim 9, further including the step of implanting impurity ions in a surface of the semiconductor substrate on both sides of the wordlines in the cell region before formation of the second insulating layer, so as to form source/drain regions.

* * * * *